(12) United States Patent
Winstead et al.

(10) Patent No.: US 7,795,091 B2
(45) Date of Patent: Sep. 14, 2010

(54) METHOD OF FORMING A SPLIT GATE MEMORY DEVICE AND APPARATUS

(76) Inventors: Brian A. Winstead, 5709 Joe Sayers Ave., Austin, TX (US) 78756; Rajesh A. Rao, 12524 Zeller La., Austin, TX (US) 78753; Spencer E. Williams, 5902 Highland Hills Trail, Austin, TX (US) 78731

( * ) Notice: Subject to any disclaimer, the term of this patent is extended or adjusted under 35 U.S.C. 154(b) by 85 days.

(21) Appl. No.: 12/112,664

(22) Filed: Apr. 30, 2008

(65) Prior Publication Data

US 2009/0273013 A1    Nov. 5, 2009

(51) Int. Cl.
*H01L 21/336* (2006.01)
(52) U.S. Cl. ............... 438/257; 438/266; 257/E21.681
(58) Field of Classification Search ........... 438/257, 438/266; 257/316, E21.681
See application file for complete search history.

(56) References Cited

U.S. PATENT DOCUMENTS

| | | | |
|---|---|---|---|
| 5,397,724 | A | 3/1995 | Nakajima et al. |
| 6,281,076 | B1 | 8/2001 | Choi et al. |
| 6,844,238 | B2 | 1/2005 | Yeo et al. |
| 7,164,167 | B2 | 1/2007 | Iwata et al. |
| 2002/0068446 | A1 | 6/2002 | Wu et al. |
| 2002/0132413 | A1 | 9/2002 | Chang et al. |
| 2003/0173616 | A1 | 9/2003 | Kusumi et al. |
| 2006/0008992 | A1 | 1/2006 | Shukuri |
| 2006/0019445 | A1* | 1/2006 | Chen .................. 438/257 |
| 2007/0077705 | A1 | 4/2007 | Prinz et al. |
| 2007/0218633 | A1 | 9/2007 | Prinz et al. |
| 2007/0232041 | A1 | 10/2007 | Choi et al. |
| 2008/0153298 | A1 | 6/2008 | Hui et al. |

FOREIGN PATENT DOCUMENTS

| | | |
|---|---|---|
| KR | 1020010036790 A | 5/2001 |
| KR | 1020030097446 A | 12/2003 |

OTHER PUBLICATIONS

PCT Search Report and Written Opinion for PCT Application No. PCT/US2008/050693 mailed May 30, 2008.

(Continued)

*Primary Examiner*—Quoc D Hoang
(74) *Attorney, Agent, or Firm*—Kim-Marie Vo

(57) ABSTRACT

A split-gate memory device has a select gate having a first work function overlying a first portion of a substrate. A control gate having a second work function overlies a second portion of the substrate proximate the first portion. When the majority carriers of the split-gate memory device are electrons, the first work function is greater than the second work function. When the majority carriers of the split-gate memory device are holes, the first work function is less than the second work function. First and second current electrodes in the substrate are separated by a channel that underlies the control gate and select gate. The differing work functions of the control gate and the select gate result in differing threshold voltages for each gate to optimize device performance. For an N-channel device, the select gate is P conductivity and the control gate is N conductivity.

16 Claims, 9 Drawing Sheets

OTHER PUBLICATIONS

Figure 1:
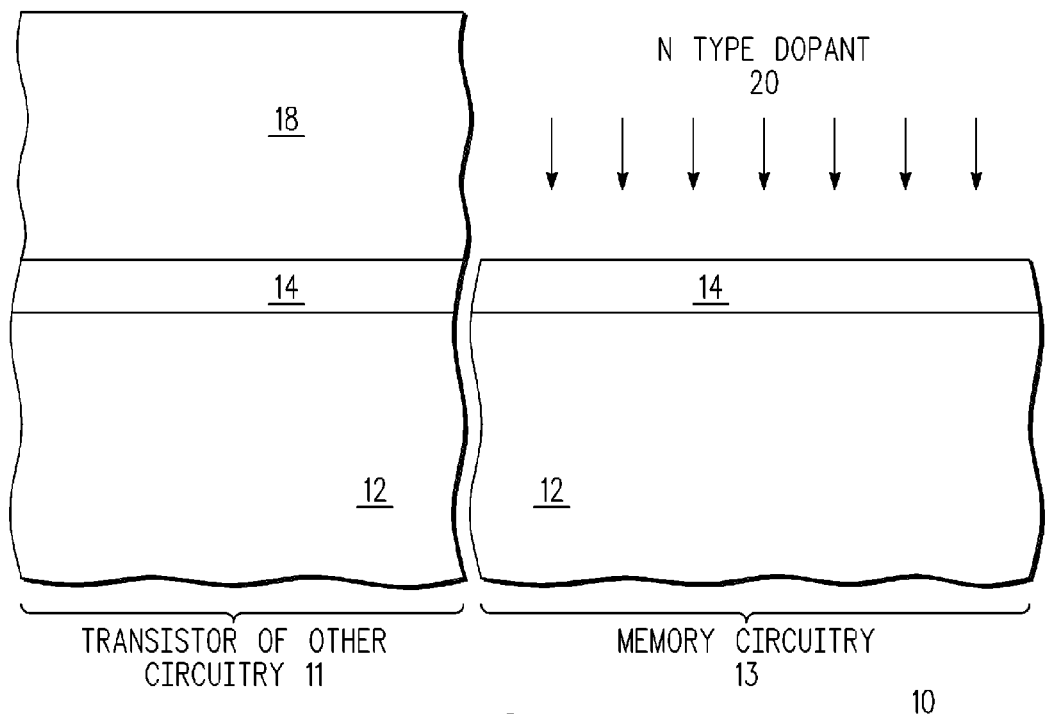
Figure 2:
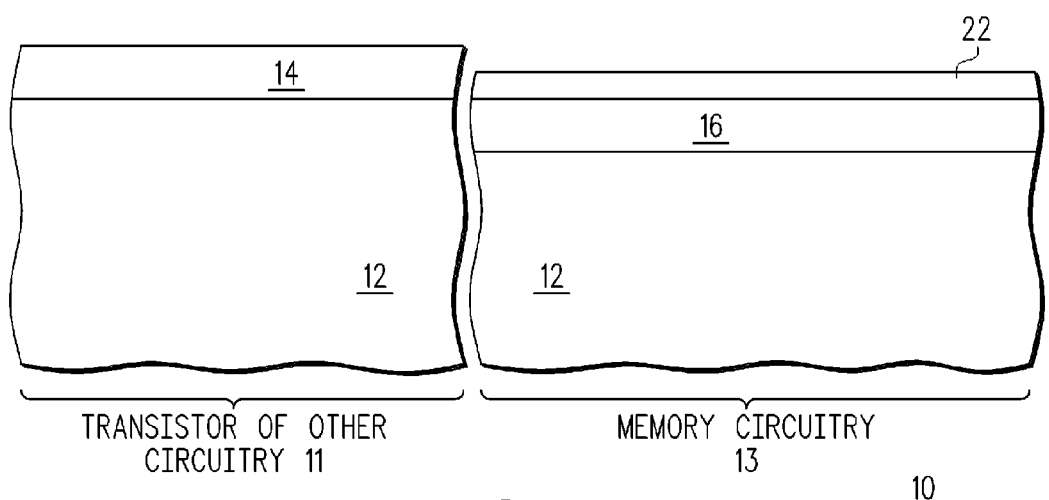
Figure 3:
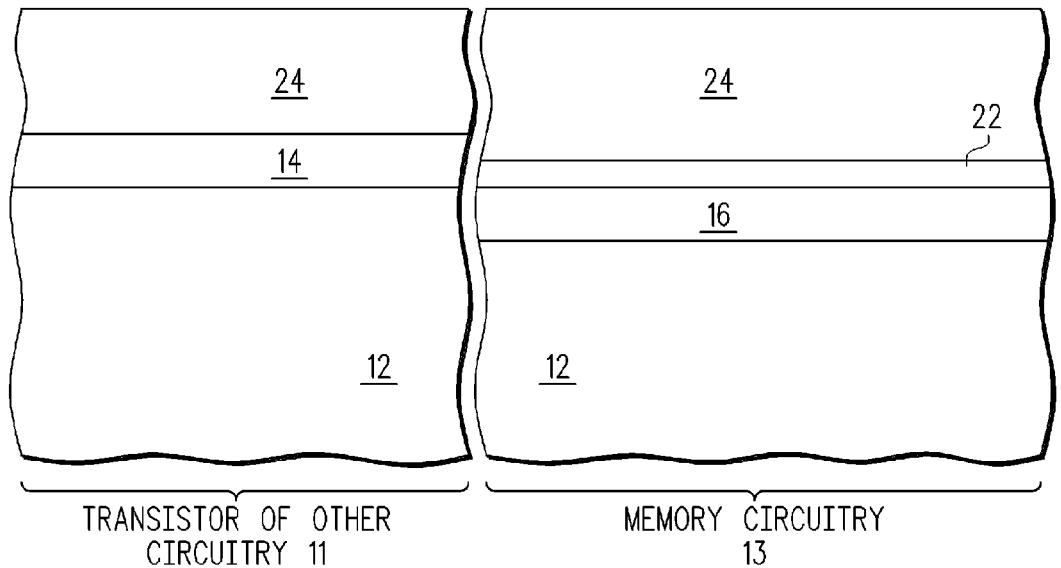
Figure 4:
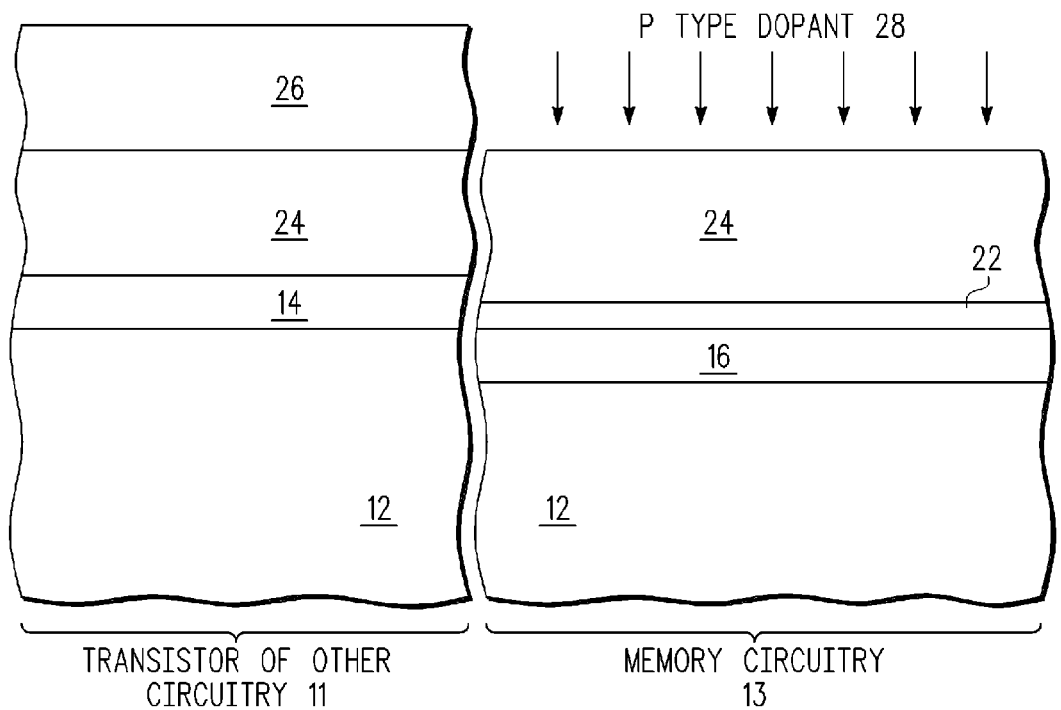

PCT Search Report and Written Opinion for PCT Application No. PCT/US2009/035299 mailed on Jan. 4, 2010.

U.S. Appl. No. 11/625,882, filed Jan. 23, 2007.

Kuo, Victor Chao-Wei et al; "Detailed Comparisons of Program, Erase and Data Retention Characteristics between P+– and N+–Poly SONOS NAND Flash Memory"; Proceedings of the 2006 IEEE International Workshop on Memory Technology, Design, and Testing; May 2006; 3 pp; IEEE Computer Society.

Sung, Suk-Kang et al.; "SONOS -type FinFET Device Using P+ PolySi Gate and High-k Blocking Dielectric Integrated on Cell Array and GSL/SSL for Multi-Gigabit NAND Flash Memory"; 2006 Symposium on VLSI Technology Digest of Technical Papers; Aug. 2006; 2 pp; IEEE.

Sadd, M. et al.; "Improved Window with a P-doped Control Gate in a Nano-crystal Split-gate Memory"; IEEE 2006 Silicon Nanoelectronics Workshop; Jun. 11-12, 2006; Title page and pp. 99-100; IEEE.

* cited by examiner

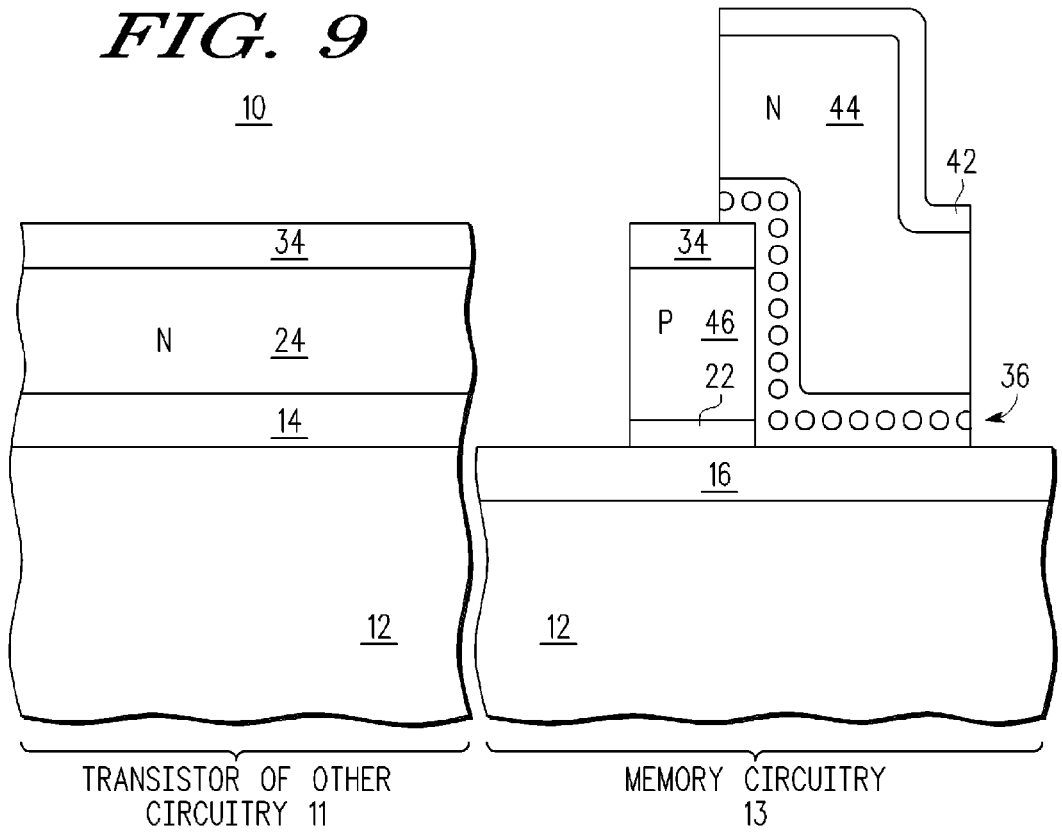
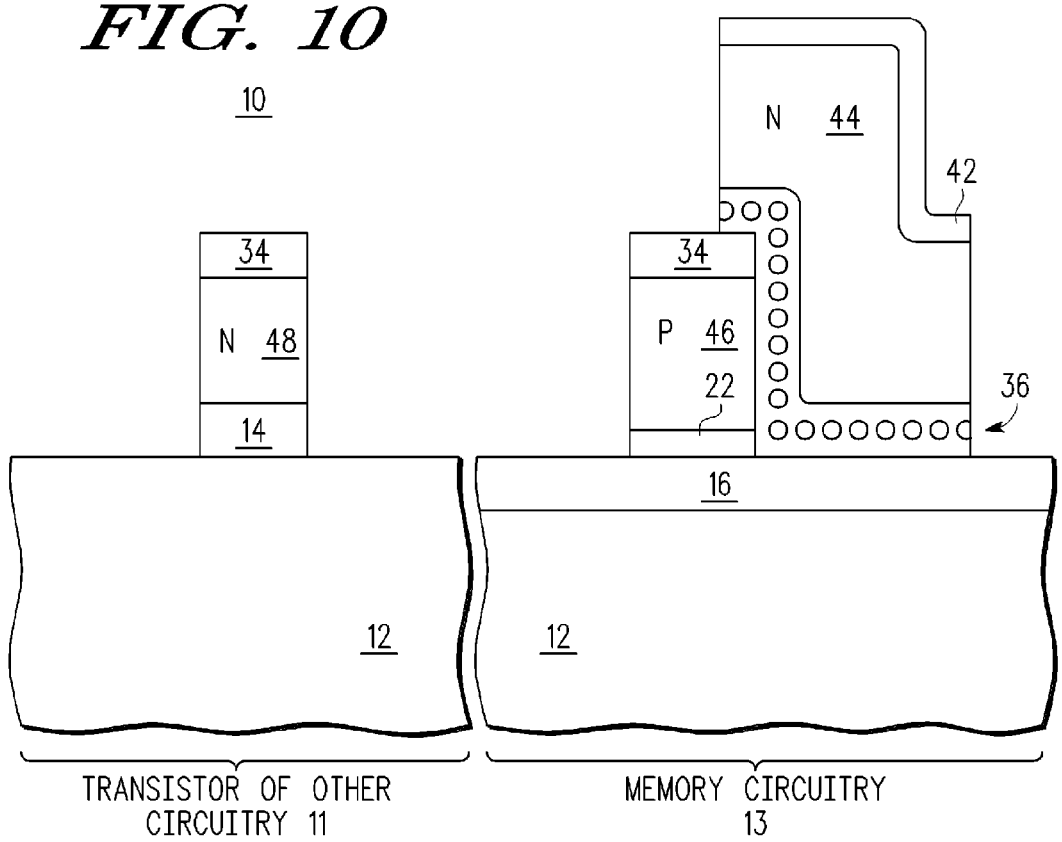

METHOD OF FORMING A SPLIT GATE MEMORY DEVICE AND APPARATUS

BACKGROUND

1. Field

This disclosure relates generally to semiconductors, and more specifically, to memory and data storage devices circuitry having two gates.

2. Related Art

A particular type of memory cell is known as a split gate memory which indicates the presence of a control gate and a select gate. Split gate memory cells function as one form of non-volatile memory (NVM). Both gate electrodes affect the operation of the memory cell. A split gate memory cell has two distinguishable channel regions, respectively controlled by a select gate and a control gate, which are electrically separated by a dielectric. The select gate channel acts as an access device to select the memory cell under the control gate during read or program operations. One form of a split gate memory cell uses a control gate and a select gate of a same conductivity type. The threshold voltage of the channel is typically controlled by substrate doping within the channel region.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 1-17 illustrate in cross-sectional form a method for forming a split gate memory device in accordance with the present invention;

DETAILED DESCRIPTION

For efficient operation of a split gate memory device with thin control gate dielectrics, it is desirable to have a low-magnitude natural threshold voltage, $V_{tn}$, for the control gate channel. The low magnitude $V_{tn}$ is desirable because a high control gate bias is required during read if the $V_{tn}$ is high, which results in large electric fields in the dielectric surrounding the charge storage regions. For thin dielectric layers, such high fields may disturb the programmed charge in the biased cells. Furthermore, it is desirable to have a sufficiently high threshold voltage, $V_t$, for the select gate channel in order to minimize leakage current for an unselected cell. A low threshold voltage for the control gate is desired to be able to read the memory cell with low voltage and not disturb the programmed charge of the selected memory cell. A high threshold voltage for the select gate is desired because leakage current through the channel is minimized in unselected memory cells. The natural threshold voltage associated with the control gate and select gate portions of a split gate memory cell is largely determined by a difference in the work function of each gate and the underlying channel region. There is herein provided a method and resulting memory structure in which the work function of the select gate is greater than the work function of the control gate for an N-type memory cell (electron majority carrier). For a P-type (hole majority carrier) memory cell an opposite relationship in work function is implemented. As a result, for a memory cell which has channel regions of similar work function underlying the control gate and select gate, the control gate portion has a lower threshold voltage relative to the threshold voltage of the select gate for an N-type split gate memory cell. In one embodiment the method described herein implements a select gate having a work function that is larger than that of a channel below it and implements a control gate having a work function that is lower than that of the channel below it.

Illustrated in FIG. 1 is a semiconductor device 10 at an early stage of the formation of a split-gate memory cell. The semiconductor device 10 is bifurcated into two portions. A first portion implements a transistor of other circuitry 11 and a second portion implements memory circuitry 13. Electrical isolation separates the two portions and the two portions may be implemented in close proximity on a single integrated circuit die or in locations on the single integrated circuit die that are not in close proximity. A substrate 12 is provided. In one form the substrate 12 is a silicon substrate but other semiconductor materials may be used for substrate 12. For example a gallium-arsenide substrate material may be used or a silicon-on-insulator (SOI) substrate may be used. Overlying the substrate 12 is a dielectric layer 14. In one form the dielectric layer 14 is an oxide such as silicon dioxide. In this embodiment, dielectric layer 14 is a relatively thick dielectric layer and is intended to function as a gate dielectric for a high voltage tolerant transistor in the other circuitry 11. Overlying the other circuitry 11 is a mask 18. In one form the mask 18 is photoresist. Other mask materials may be used. With mask 18 in place to protect the other circuitry 11, an N-type dopant 20 is implanted into the substrate 12 of memory circuitry 13. Various dopants may be used as the N-type dopant 20. Before the mask 18 is removed, the dielectric layer 14 is removed from above the memory circuitry 13. Once dielectric layer 14 is removed, a different and, in this embodiment, thinner dielectric layer 22 is formed overlying substrate 12. The dielectric layer 22 will function as a gate dielectric for memory cells within memory circuitry 13 and, in one form, is intentionally desired to be thinner than the gate dielectric of high voltage transistors within the other circuitry 11.

Illustrated in FIG. 2 is further processing of semiconductor device 10 wherein the mask 18 is removed from above the other circuitry 11. The implant of N-type dopant 20 forms a counter-doping region 16 within the substrate 12. The doping type within counter-doping region 16 differs from the doping type of the substrate 12 and thus is termed counter-doping. The counter-doping dopant type is chosen to lower the work function of the channel for N-channel (N-type) devices (e.g. N-type dopants such as phosphorus, arsenic, or antimony for a silicon substrate) and raise the work function of the channel for P-channel (P-type) devices (e.g. P-type dopants such as boron or indium for a silicon substrate). It should be understood that the formation of a counter-doping region is optional and is not required. In another form the channel may be implemented with no doping. Also illustrated in FIG. 2 is the formation of the dielectric layer 22 which is thinner than the dielectric layer 14 in this example.

Illustrated in FIG. 3 is further processing of semiconductor device 10 wherein a gate material layer 24 is deposited over the substrate 12 and onto each of the dielectric layer 14 and the dielectric layer 22. In one form the gate material layer 24 is a layer of polysilicon that is undoped. In other forms various materials which are conductive, or which are conductive when doped, may be used in lieu of polysilicon to implement the gate material layer 24.

Illustrated in FIG. 4 is further processing of semiconductor device 10 wherein doping with a dopant of the portion of the gate material layer 24 within the memory circuitry 13 is performed. A mask 26 is provided overlying the other circuitry 11. In one form the mask 26 is photoresist. With mask 26 in place, a P-type dopant 28 is implanted into the exposed gate material layer 24. The gate material layer 24 will be used as a select gate and therefore this material is pre-doped to a desired P-type conductivity wherein the substrate 12 has in one embodiment a P-type conductivity. Various dopants may be used as the P-type dopant 28. At the completion of the implant step the mask 26 is removed from above the gate material layer 24 in the other circuitry 11.

Figure 5:
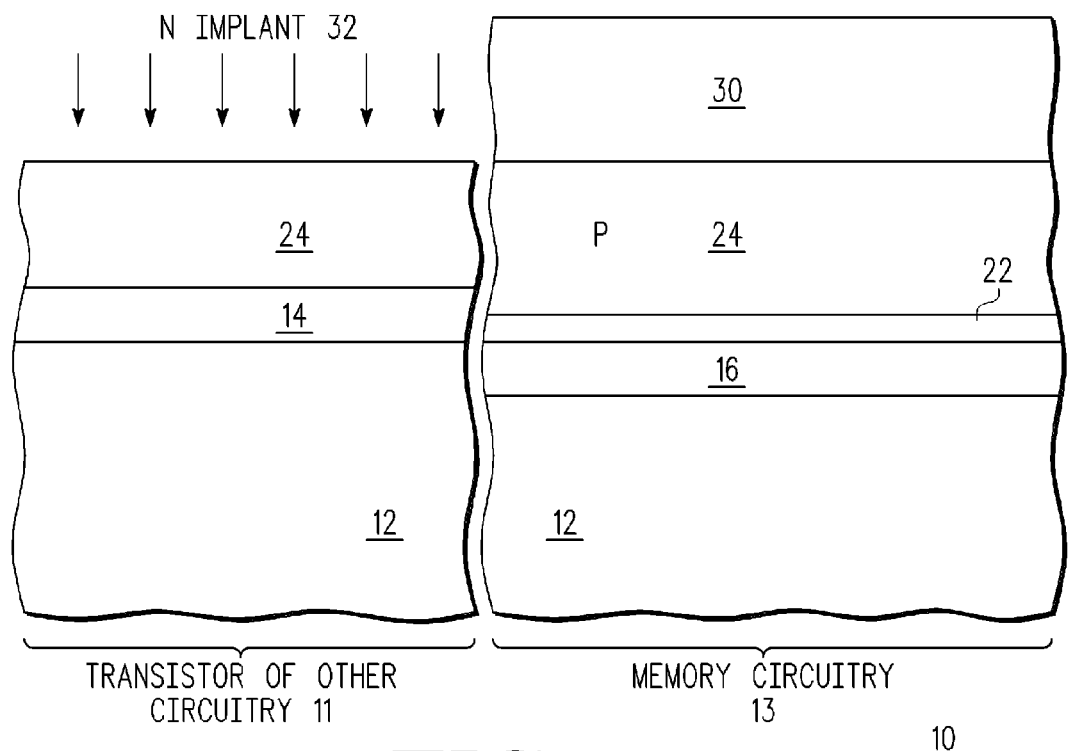

Illustrated in FIG. 5 is further processing of semiconductor device 10 wherein doping with a dopant of the portion of the gate material layer 24 within the other circuitry 11 is performed. A mask 30 is provided overlying the memory circuitry 13. In one form the mask 30 is photoresist. With mask 30 in place, an N-type dopant is implanted into the exposed gate material layer 24 via an N implant 32. The exposed portion of the gate material layer 24 is pre-doped to a desired N-type conductivity. At the completion of the N implant 32 the mask 30 is removed from above the gate material layer 24 in the memory circuitry 13.

Figure 6:
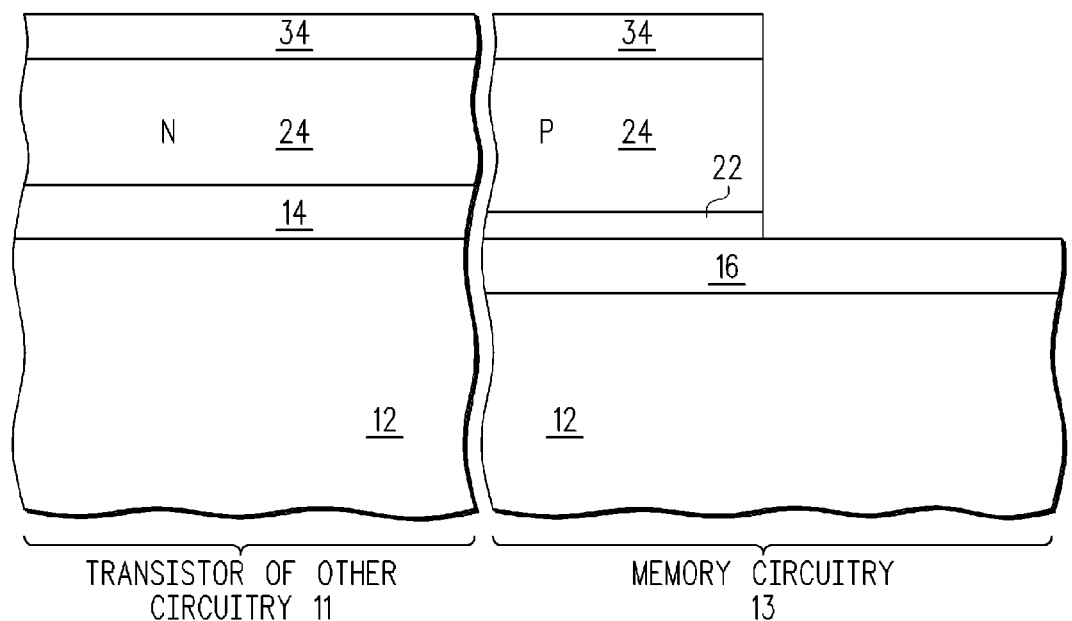

Illustrated in FIG. 6 is further processing of semiconductor device 10 wherein an antireflective coating (ARC) layer 34 is deposited on predetermined portions of the doped exposed gate material layer 24. The ARC layer 34 serves as an implant blocking layer 34 and protects the gate material layer 24 from being modified by subsequent ion implantation processes. In one form the ARC layer 34 comprises silicon nitride. A photoresist mask (not shown) is formed over all of the other circuitry 11 and over desired predetermined portions of the memory circuitry 13. With the mask in place, an etch is performed to remove exposed portions of the ARC layer 34, gate material layer 24 and the dielectric layer 22 within the memory circuitry 13. In one form the etch is a reactive ion etch (RIE). The resulting structure of semiconductor device 10 in FIG. 6 is a structure in which a portion of the counter-doping region 16 of the substrate 12 is exposed.

Figure 7:
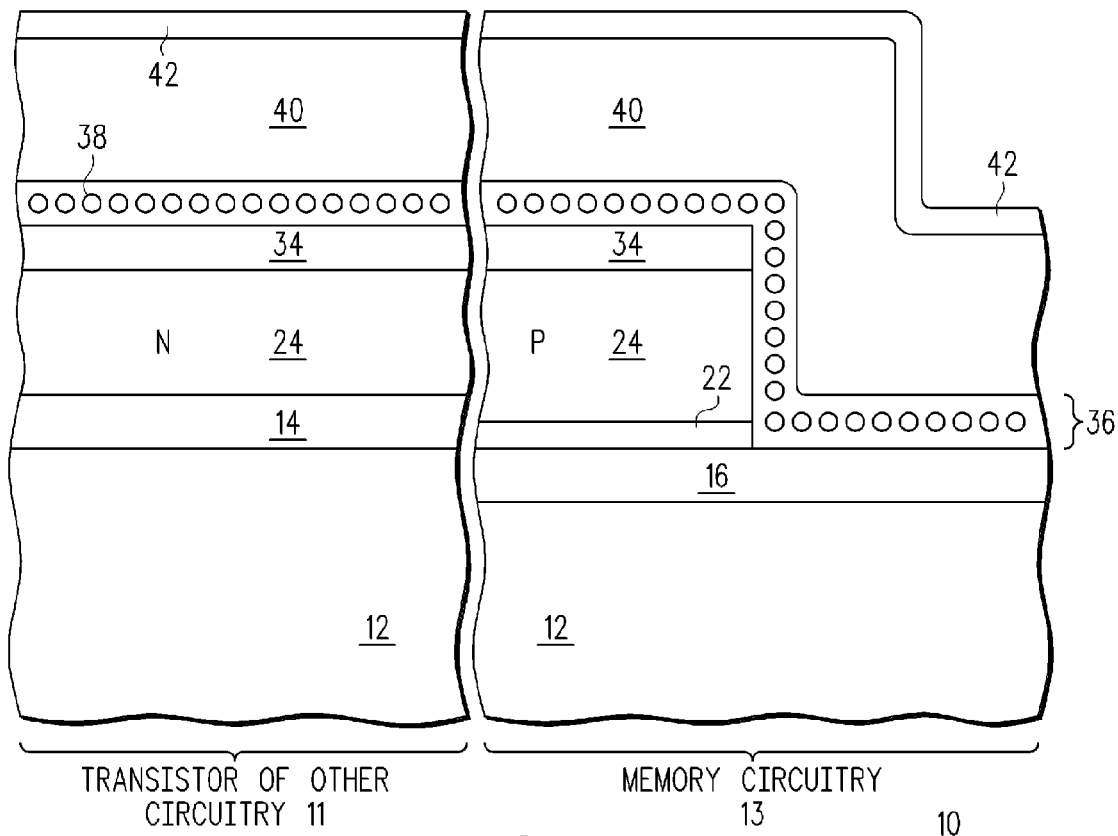

Illustrated in FIG. 7 is further processing of semiconductor device 10 wherein a discrete charge storage layer 36 is conformally formed on exposed portions of the ARC layer 34, on the exposed sidewall of ARC layer 34, gate material layer 24 and dielectric layer 22 and on exposed portions of the counter-doping region 16 of substrate 12. In one form the discrete charge storage layer 36 is formed of nanoclusters or nanocrystals that are surrounded by a dielectric such as silicon dioxide. The nanoclusters, such as a nanocluster 38, are charge trapping and thus the discrete charge storage layer 36 functions as a charge storage layer. In another form the discrete charge storage layer 36 may be implemented by a nitride layer such as silicon nitride. Overlying the discrete charge storage layer 36 is a gate material layer 40 which is deposited and is conformal. In one form the gate material layer 40 is polysilicon which is insitu doped to form an N-type layer of material. The gate material layer 40 will function as a control gate for a memory cell in the memory circuitry 13. Additionally shown in FIG. 7 is a deposited antireflective coating (ARC) layer 42. The ARC layer 42 is conformal and covers all exposed surfaces of the semiconductor device 10.

Figure 8:
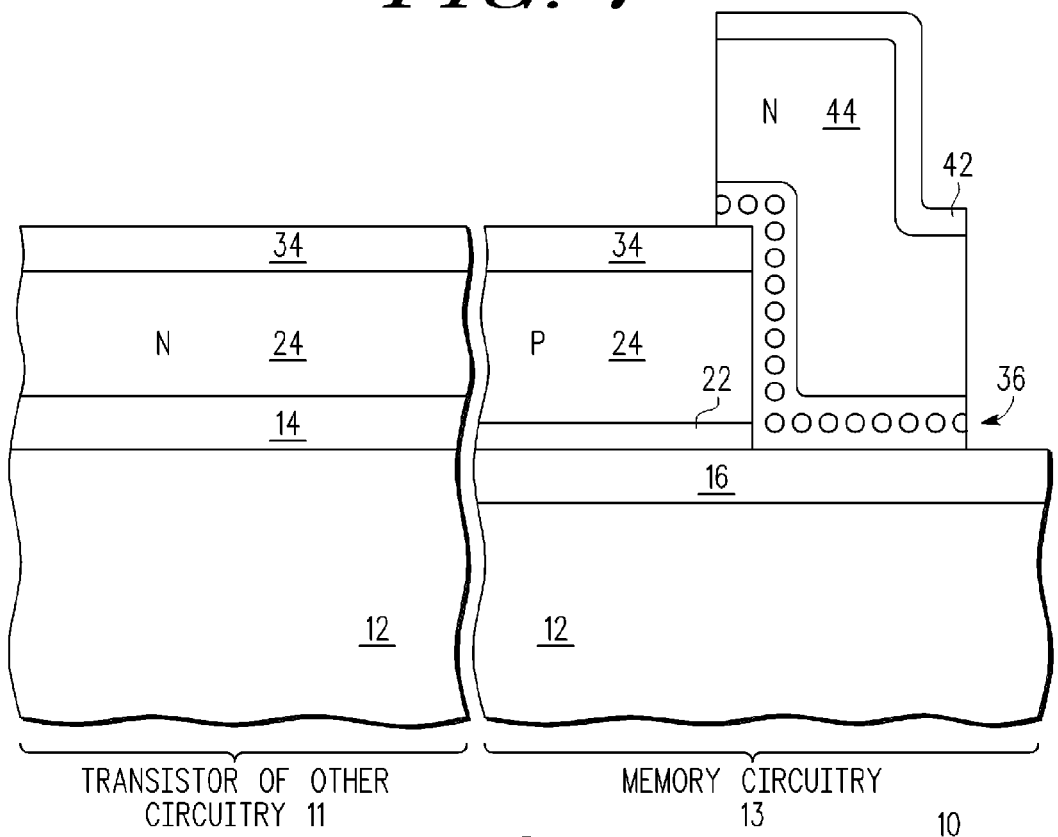

Illustrated in FIG. 8 is further processing of semiconductor device 10 wherein a mask (not shown) is provided over a portion of the ARC layer 42 where a control gate is desired to be located within the memory circuitry 13. With the mask in place, all exposed portions of the ARC layer 42, the gate material layer 40 and the discrete charge storage layer 36 are etched and removed. The resulting structure of FIG. 8 has a control gate 44 of N type conductivity that is formed from a remainder of the previously insitu doped N-type gate material layer 40. The memory circuitry 13 thus has a memory cell having a select gate from gate material layer 24 that is doped with P conductivity and a control gate 44 that is doped with N conductivity.

Illustrated in FIG. 9 is further processing of semiconductor device 10 wherein a left side of the memory cell within memory circuitry 13 is defined. A mask (not shown) is provided overlying all portions but the sections where it is desired to remove the ARC layer 34, the doped exposed gate material layer 24 and the dielectric layer 22. A conventional dry etch is performed wherein within the memory circuitry 13 a portion of the doped exposed gate material layer 24 is removed to leave a smaller dimensioned select gate 46 that was previously doped as P-type conductivity.

Illustrated in FIG. 10 is further processing of semiconductor device 10 wherein a mask (not shown) is used to protect the memory circuitry 13 and a portion of the transistor of the other circuitry 11 where it is desired to form a gate stack. A conventional dry etch is performed wherein within the other circuitry 11 there is formed a gate stack having dielectric layer 14, a gate 48 of the transistor of the other circuitry 11 and an ARC layer 34. The length of the gate 48 is optional and is determined by the mask pattern. The gate 48 of the transistor is formed from gate material layer 24 and remains N-type conductivity type.

Figure 11:
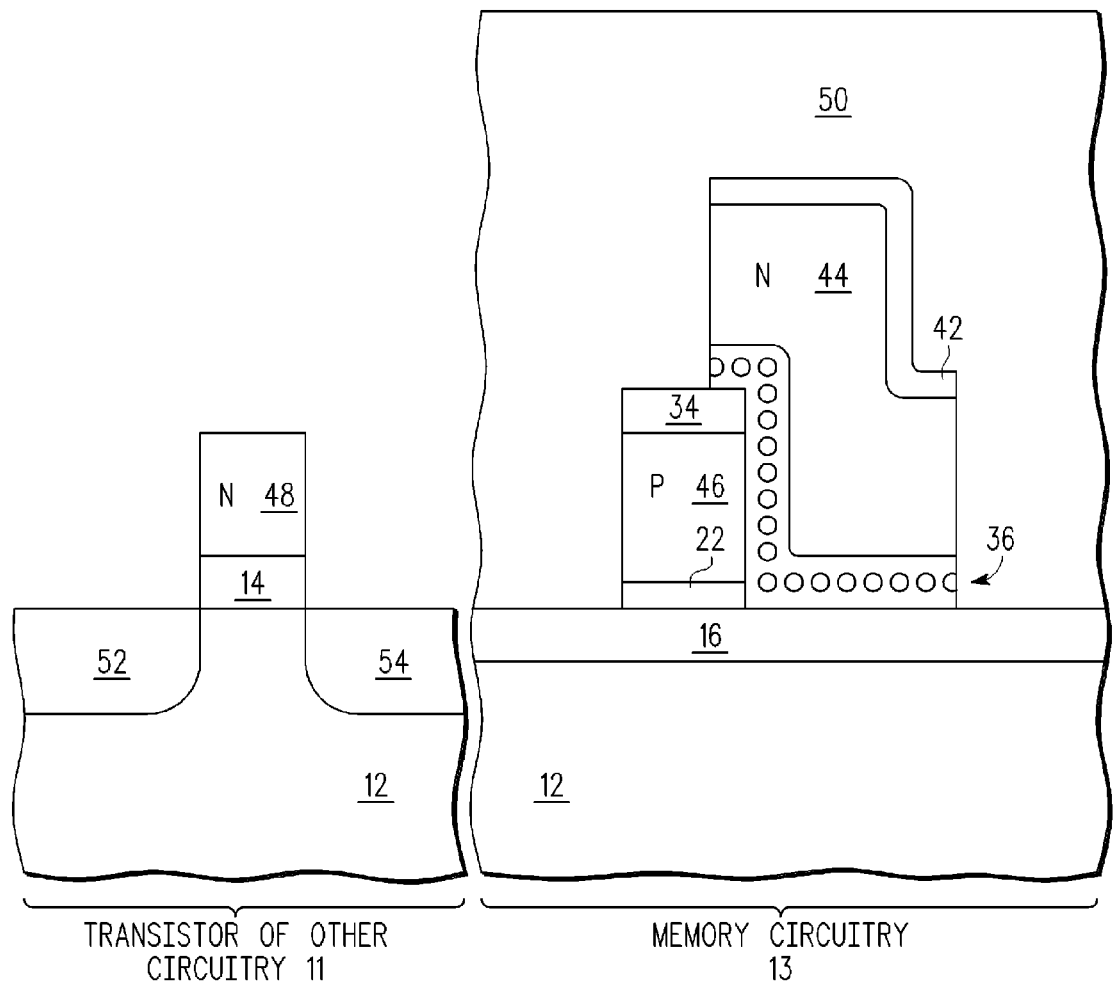

Illustrated in FIG. 11 is further processing of semiconductor device 10 wherein the memory circuitry 13 is protected or masked by a mask 50. The mask 50 in one form is photoresist. Other masking materials may be used in lieu of photoresist. With mask 50 in place an ion implant is performed to form an extension region 52 and an extension region 54 within the substrate 12 aligned to the sides of the gate stack. Upon formation of the extension region 52 and extension region 54, the ARC layer 34 is removed from the gate stack to expose the N conductivity gate 48. The mask 50 may then be removed. The extension region 52 and extension region 54 will respectively function as a first current electrode or a source and as a second current electrode or a drain of the transistor of the other circuitry 11.

Figure 12:
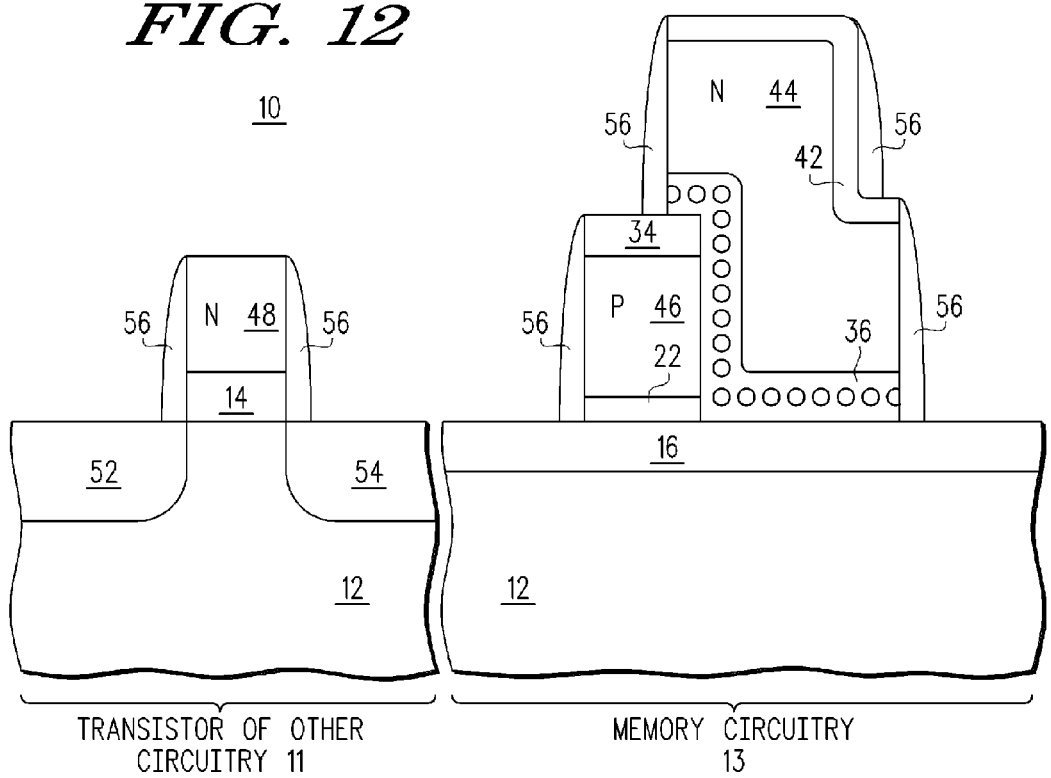

Illustrated in FIG. 12 is further processing of the semiconductor device 10 wherein temporary sidewall spacers are formed adjacent the sides of the gate 48 and dielectric layer 14 in the other circuitry 11 and adjacent the sides of the memory cell within the memory circuitry 13. Within the memory circuitry 13 the sidewall spacer 56 is formed adjacent an exposed side of each of the dielectric layer 22, the select gate 46 and ARC layer 34, an exposed side of the discrete charge storage layer 36, the control gate 44 and the ARC layer 42. The sidewall spacer 56 may be any of various materials including titanium nitride. The spacer 56 should be a material that can be etched selective to polysilicon, ARC layer 42, ARC layer 34 or other implant blocking layer, dielectric layer 14, dielectric layer 22 and charge storage layer 36.

Figure 13:
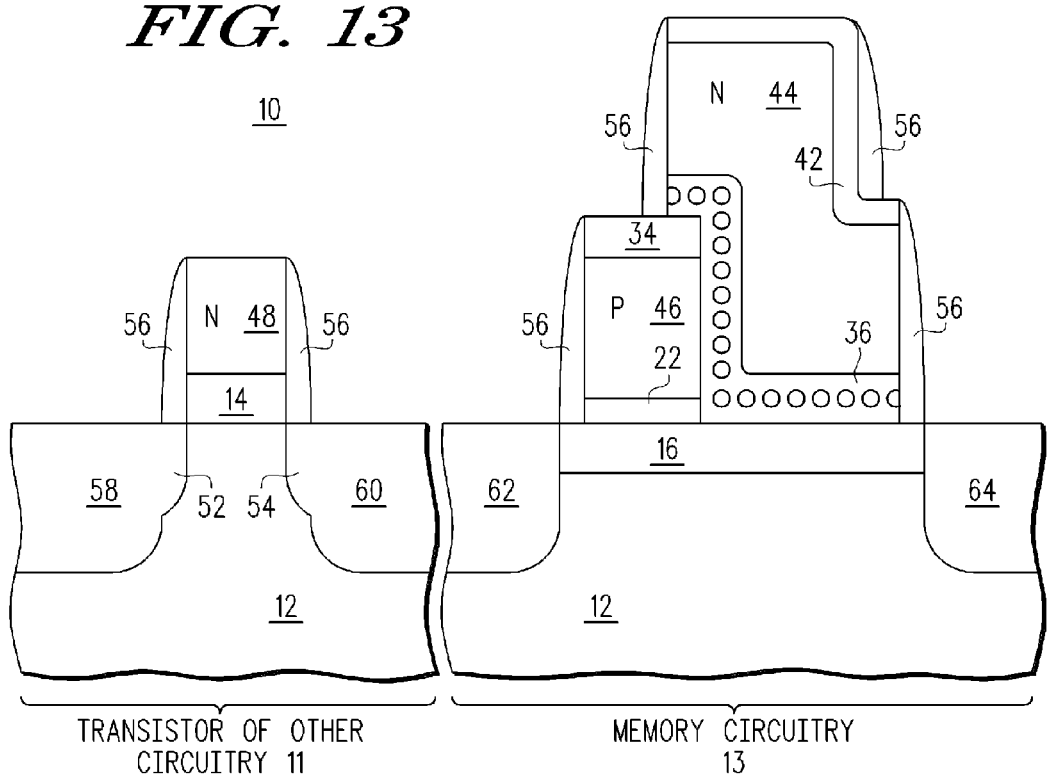

Illustrated in FIG. 13 is further processing of semiconductor device 10 wherein a dopant is ion implanted into exposed regions of the substrate 12. N-type dopants in the source/drain regions correspond to an N-channel memory device whereas P-type dopants in the source/drain regions correspond to a P-channel memory device. Deep source and drain implants are thereby performed to create a source implant region 58 and a drain implant region 60 within the other circuitry 11. This implant also results in N-type doping of the gate 48 which is desired. Additionally formed are a source implant region 62 and a drain implant region 64 within the substrate 12 for the memory cell of the memory circuitry 13. It should again be noted that source/drain implants which are predominately N-type correspond to the N-type memory cell embodiment. Within the memory circuitry 13, the ARC layer 42 protects the select gate 44 from the implant and thus the electrical properties of the select gate 44 are not modified.

Figure 14:
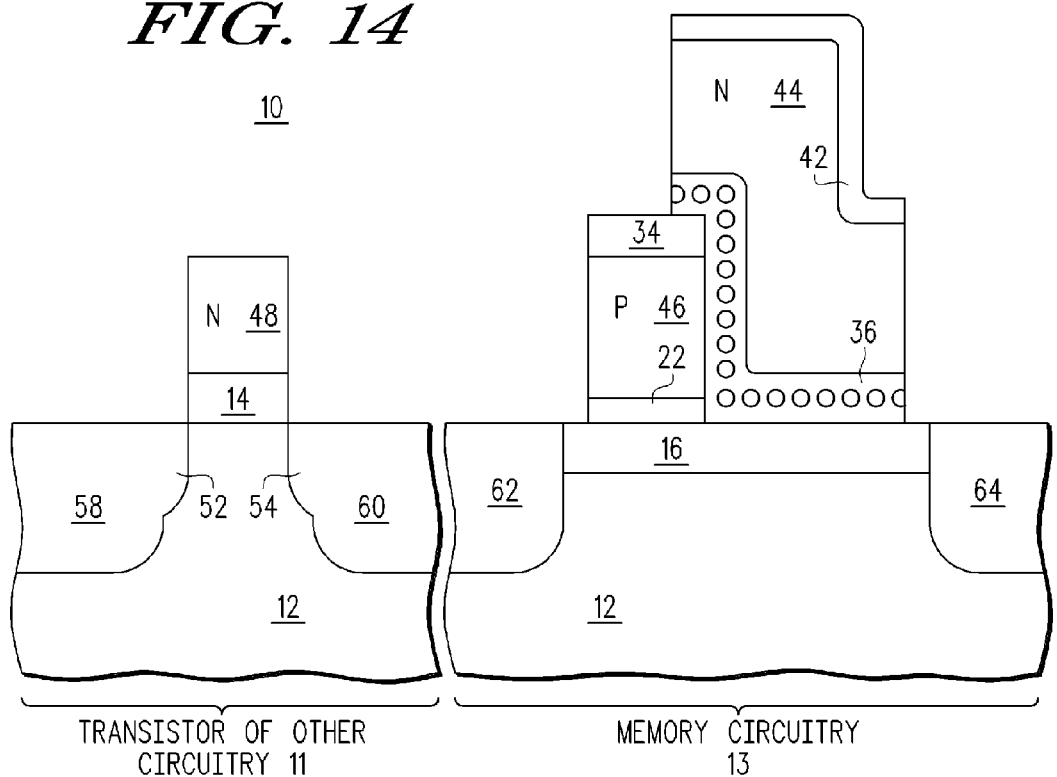

Illustrated in FIG. 14 is further processing of semiconductor device 10 wherein the temporary sidewall spacers 56 are removed by a selective wet etch. The etching of the sidewall spacers 56, when formed of a material such as titanium nitride, may be done with a conventional wet etch without removing any of the other illustrated structure.

Figure 15:
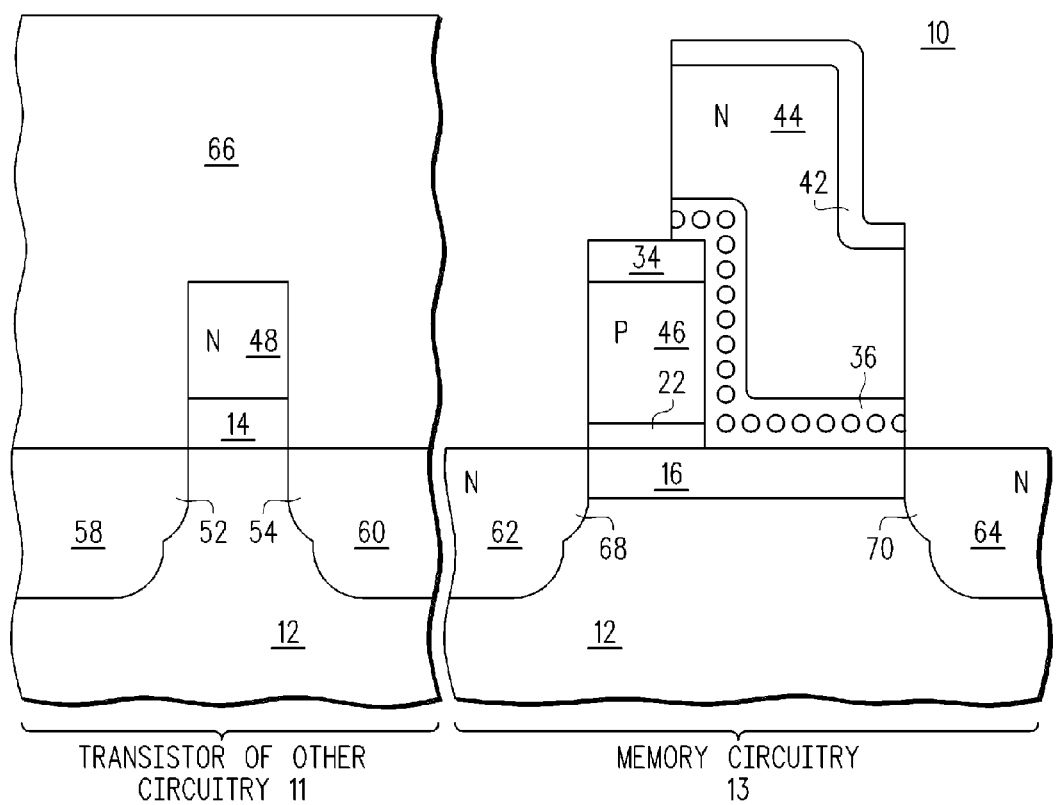

Illustrated in FIG. 15 is further processing of semiconductor device 10 wherein the other circuitry 11 is masked by a mask 66. In one form the mask 66 is photoresist. Other masking materials may be used in lieu of photoresist. An ion implant is performed. With the other circuitry 11 being protected, source and drain extension implants are formed within the memory cells of the memory circuitry 13. In one form a source/drain extension implant region 68 is formed which may laterally overlap the counter-doping region 16. A source/drain extension implant region 70 is formed which also may laterally overlap the counter-doping region 16. The source/drain extension implants are primarily N-type for an N-channel memory cell and primarily P-type for a P-channel memory cell. The resulting source and drain of the memory cell of memory circuitry 13 is now aligned with the overlying edges of the select gate 46 and the control gate 44. Thus the formation of the source and drain electrodes of the memory cell is self-aligning. The ARC layer 34 protects the underlying select gate 46 from the doping effects of the ion implantation used to form the source and drain extension implants.

Figure 16:
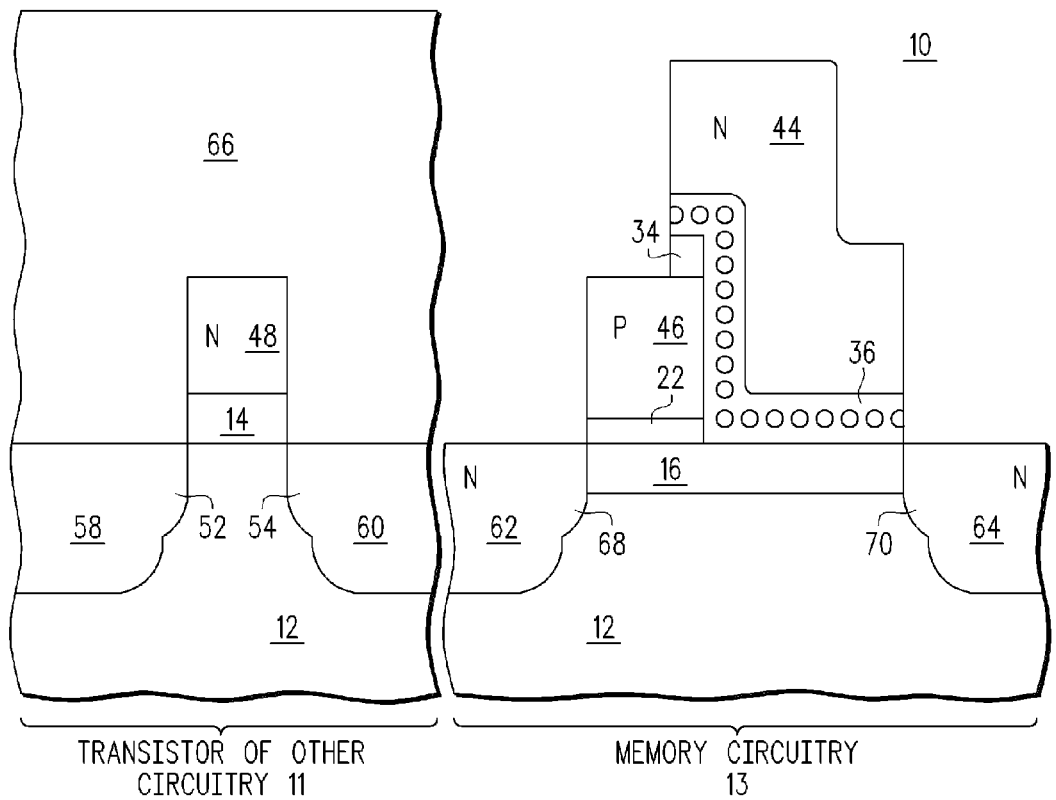

Illustrated in FIG. 16 is further processing of semiconductor device 10 wherein the ARC layer 42 is removed from above the control gate 44 that has N conductivity. Also, exposed portions of the ARC layer 34 is removed from above the select gate 46 that has P conductivity. An unexposed portion of ARC layer 34 that underlies the discrete charge storage layer 36 is left intact. A conventional etch is used to remove the exposed portions of the ARC layer 42 and ARC layer 34.

Figure 17:
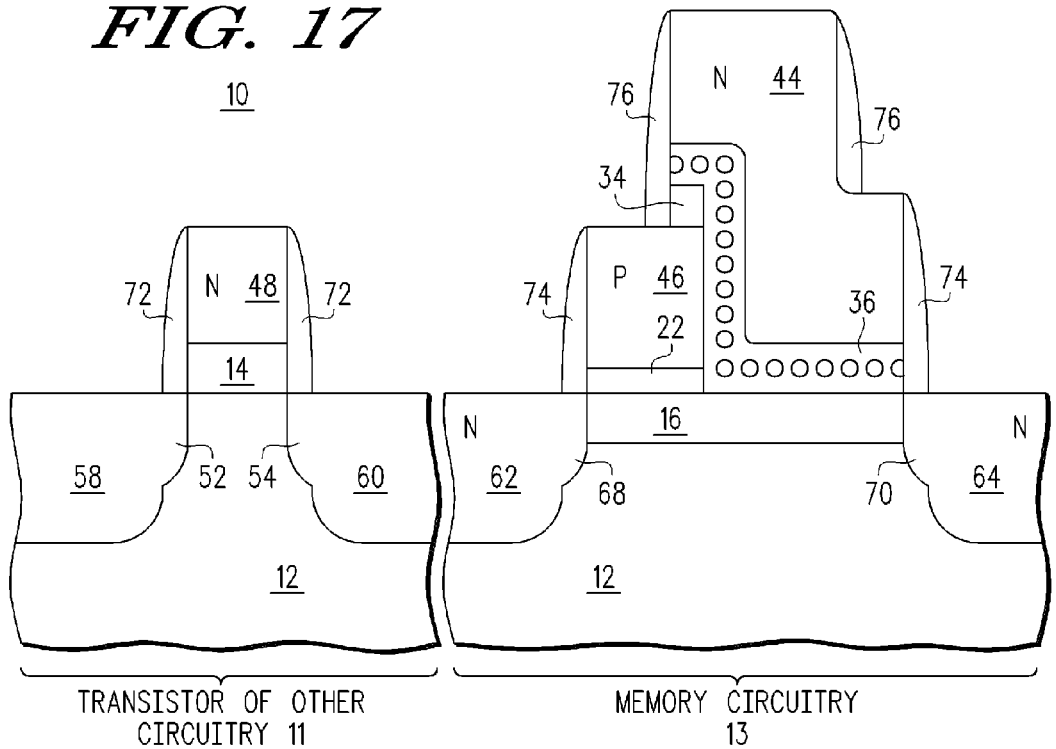

Illustrated in FIG. 17 is further processing of semiconductor device 10 wherein final sidewall spacers are formed on exposed sidewalls of the gate structures of the transistor of other circuitry 11 and the memory cell of memory circuitry 13. In particular a sidewall spacer 72 is formed adjacent exposed surfaces of the gate 48 and the gate dielectric of dielectric layer 14. A sidewall spacer 74 is formed adjacent exposed surfaces of the dielectric layer 22, the select gate 46, the discrete charge storage layer 36 and a portion of the control gate 44. A sidewall spacer 76 is formed adjacent remaining exposed surfaces of the control gate 44, the ARC layer 34 and the discrete charge storage layer 36. Sidewall spacers 72, 74 and 76 function primarily to protect certain surfaces of the gate structures from subsequent silicidation which is performed to enable low resistance electrical contacts (not shown) to the source, drain, control gate and select gate. Undesired silicidation can modify the electrical properties of the devices and possibly cause unintended electrical connections.

In another embodiment the process to form a split-gate memory uses the same steps disclosed in connection with FIGS. 1-10. However, in FIG. 11 the ARC layer 42 and the portion of the ARC layer 34 having an exposed top surface are both removed as opposed to being left in the structure. With mask 50 in place, an ion implant is performed to form an extension region 52 and an extension region 54 within the substrate 12 which are aligned to the sides of the gate stack as discussed previously in FIG. 11. The processing of FIG. 12 is not performed and the processing of FIG. 13 is deferred until later. The processing of FIG. 14 is also not performed. Rather, from FIG. 11 as modified above the next processing is that of FIG. 15. In this embodiment in FIG. 15 there is also no formation of deep source/drain implants. In FIG. 15 only source and drain extension regions are formed in the substrate 12. At this point sidewall spacer formation of FIG. 17 is performed. After the formation of sidewall spacers in FIG. 17, deep source/drain structures are formed to complete the formation of a split-gate memory cell in accordance with an alternate embodiment.

By now it should be appreciated that there has been provided a split-gate memory having a select gate of P conductivity and a control gate of N conductivity for an N-channel memory cell. The P conductivity of the select gate provides a high threshold voltage for the select function. The N conductivity of the control gate provides a low threshold voltage for the biasing function to read the memory cell and avoid disturbing the cell or adjacent memory cells. In other words the work function of the select gate is greater than the work function of the control gate. Typically the differential between the work function of the select gate and the control gate is an amount on the order of equal to or greater than 300 milli-electron volts (meV). Therefore, for N-channel memory cells the work function of the select gate is greater than the work function of the control gate by an amount on the order of greater than 300 milli-electron volts. As used herein the term "work function" is defined as the minimum energy, typically measured in electron volts, needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function relationship between the select gate and the control gate of a split gate memory cell is specifically adjusted. When the majority carriers in the channel of the split-gate memory are electrons and the majority carrier type is N conductivity, the threshold voltage of the control gate is lower than the threshold voltage of the select gate in the case that the work functions of the channel regions underlying the control gate and select gate are similar. Because, for the case of an N-type cell with a P-type substrate in the absence of counterdoping, the work function of the select gate is higher than the work function of the channel below it and the work function of the control gate is lower than the channel below it, counter-doping of the channel is not required, although may be optional. It should be understood that embodiments that are discussed apply to both N-channel transistors and P-channel transistors wherein complementary conductivity is implemented when implementing N-channel and P-channel devices. Therefore, when the majority carriers are holes and the majority carrier type is P conductivity, the threshold voltage of the control gate is higher than the threshold voltage of the select gate in the case where the work functions of the channel regions underlying the control gate and the select gate are similar. In this conductivity form the work function of the select gate is lower than the work function of the channel below it and the work function of the control gate is higher than the channel below it for the case of a substrate that is doped N-type. Numerous embodiments described herein may be used and the selection of which embodiment may depend upon processing requirements and desired transistor specifications.

Although the invention has been described with respect to specific conductivity types or polarity of potentials, skilled artisans appreciated that conductivity types and polarities of potentials may be reversed. Moreover, the terms "front," "back," "top," "bottom," "over," "under", "above", "below"

and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In one form there is herein provided a method of forming a split-gate memory device wherein a select gate is formed having a first work function overlying a first portion of a substrate. A control gate having a second work function is formed overlying a second portion of the substrate proximate the first portion. For a first majority carrier type split-gate memory device, the first majority carrier type are electrons and the first work function is greater than the second work function. For a second majority carrier type split-gate memory device, the second majority carrier type are holes and the first work function is less than the second work function. A first current electrode is formed in the substrate and a second current electrode is formed in the substrate separated from the first current electrode by a channel underlying the control gate and select gate. In one form for the first majority carrier type, the first work function is greater than the second work function by an amount on the order of greater than 300 milli-electron volts. In another form for the second majority carrier type, the first work function is less than the second work function by an amount on the order of greater than 300 milli-electron volts. In another form the select gate and the substrate are of a common conductivity type. In one form prior to forming the select gate and the control gate a counter doped region proximate a top surface of the substrate is formed in at least the first and second portions. The counter doped region is configured to modify a work function of a channel region within the first and second portions of the substrate. The counter doped region includes a conductivity type opposite to a conductivity type of the substrate. In another form the counter doped region is formed by implanting N-type dopant species for the first majority carrier type split-gate memory device. In another form for an N-type split gate memory device, the counter doped region is configured to lower the work function of the channel region. For a P-type split gate memory device, the counter doped region is configured to raise the work function of the channel region. In another form the select gate is formed by forming a layer of select gate dielectric over at least the first portion of the substrate. A layer of select gate material is formed overlying the layer of select gate dielectric. Dopant is implanted into the layer of select gate material, wherein the dopant comprises a conductivity type suitable for establishing the first work function. In another form forming the select gate is formed by forming an implant blocking layer overlying the layer of select gate material. A first edge of the select gate is defined in the layer of select gate material, wherein defining the first edge includes etching to remove the implant blocking layer, the layer of select gate material and the layer of select gate dielectric in at least a region overlying the second portion of the substrate intended for use with respect to the control gate. The control gate is formed by forming a discrete charge storage layer overlying (i) the implant blocking layer, (ii) the layer of select gate material, (iii) the first edge of the select gate, and (iv) a surface of the substrate exposed by defining the first edge of the select gate. A layer of control gate material is formed overlying the discrete charge storage layer. The control gate is defined in the layer of control gate material. Defining the control gate includes etching to remove the layer of control gate material and the discrete charge storage layer in at least a region not intended for use as the control gate. A portion of the control gate overlies the second portion of the substrate. In another form the implant blocking layer is a nitride antireflective coating (ARC) layer. In another form a portion of the control gate also overlies the first edge of the select gate. In yet another form the select gate is formed by defining a second edge of the select gate. Defining the second edge includes etching to remove the implant blocking layer, the layer of select gate material and the layer of select gate dielectric in at least portions thereof outside of a region overlying the first portion of the substrate intended for use with respect to the select gate. Temporary sidewall spacers are formed along exposed sidewalls of the select gate and the control gate. Deep source/drain implant regions are formed within the substrate that are aligned to the temporary sidewall spacers and proximate to the second edge of the select gate and an edge of the control gate opposite to the second edge of the select gate. The temporary sidewall spacers are removed. Source/drain extension implant regions are formed within the substrate in at least regions of the substrate underlying the temporary sidewall spacers prior to their removal. The implant blocking layer overlying the select gate is removed. Sidewall spacers along exposed sidewalls of the select gate and the control gate are formed. In another form the implant blocking layer overlying the select gate is removed by removing substantially all portions, wherein a portion of the implant blocking layer remains proximate the first edge of the select gate, underlying a portion of the discrete charge storage layer of the control gate proximate the first edge of the select gate. In another form the discrete charge storage layer is one selected from the group consisting of a nanocluster layer and a nitride layer containing trap locations.

In another form there is provided a method of forming a split-gate memory device wherein a counter doped region is formed proximate a top surface of a substrate in at least first and second portions. The counter doped region is configured to modify a work function of a channel region within the first and second portions of the substrate. A select gate having a first work function is formed overlying a first portion of a substrate. Forming the select gate includes (i) forming a layer of select gate dielectric over at least the first portion of the substrate, (ii) forming a layer of select gate material overlying the layer of select gate dielectric, and (iii) implanting dopant into the layer of select gate material. The dopant is a conductivity type suitable for establishing the first work function. A control gate is formed having a second work function overlying a second portion of the substrate proximate the first portion. For a first majority carrier type split-gate memory device, wherein the first majority carrier type comprises electrons, the first work function is greater than the second work function. For a second majority carrier type split-gate memory device, wherein the second majority carrier type comprises holes, the first work function is less than the second work function. A first current electrode is formed in the substrate. A second current electrode is formed in the substrate separated from the first current electrode by a channel underlying the control gate and select gate. In another form the select gate is formed by forming an implant blocking layer overlying the layer of select gate material. A first edge of the select gate is defined in the layer of select gate material, wherein defining the first edge includes etching to remove the implant blocking layer, the layer of select gate material and the layer of select gate dielectric in at least a region overlying the second portion of the substrate intended for use with respect to the control gate. The control gate in one form is formed by forming a discrete charge storage layer overlying (i) the implant blocking layer, (ii) the layer of select gate material, (iii) the first edge of the select gate, and (iv) a surface of the substrate exposed by defining the first edge of the select gate. A layer of control gate material is formed overlying the discrete charge storage layer. The control gate is defined in the layer of control gate material by etching to remove the layer of control gate material and the discrete charge storage layer in at least a region not intended for use as the control gate. A portion of the control gate overlies the second portion of the substrate.

In another form there is herein provided a split-gate memory device having a select gate having a first work function overlying a first portion of a substrate. A control gate has a second work function overlying a second portion of the substrate proximate the first portion, wherein (i) for a first majority carrier type split-gate memory device, wherein the first majority carrier type comprises electrons, the first work function is greater than the second work function and (ii) for a second majority carrier type split-gate memory device, wherein the second majority carrier type comprises holes, the first work function is less than the second work function. A first current electrode in the substrate and a second current electrode in the substrate is separated from the first current electrode by a channel underlying the control gate and select gate. In another form a counter doped region is proximate a top surface of the substrate in at least the first and second portions. The counter doped region is configured to modify a third work function of a channel region within the first and second portions of the substrate. For an N-type split gate memory device, the counter doped region is configured to lower the third work function of the channel region. For a P-type split gate memory device, the counter doped region is configured to raise the work function of the channel region. In another form the select gate has a layer of select gate dielectric over at least the first portion of the substrate. A layer of select gate material overlies the layer of select gate dielectric, wherein the layer of select gate material includes a dopant layer, wherein the dopant comprises a conductivity type suitable for establishing the first work function.

Although the invention is described herein with reference to specific embodiments, various modifications and changes can be made without departing from the scope of the present invention as set forth in the claims below. For example, the sequence of etches leading to formation of the select gate and control gate may be modified or reversed. The shapes and exact position of the select gate relative to the control gate may be modified. Various forms of ion implementation may be used including angled or halo implants. Various semiconductor technologies, including gallium arsenide and metal semiconductor oxide (MOS) may be used to implement the split-gate memory cells.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a split-gate memory device comprising:
    forming a select gate having a first work function overlying a first portion of a substrate;
    forming a control gate having a second work function overlying a second portion of the substrate proximate the first portion, wherein (i) for a first majority carrier type split-gate memory device, wherein the first majority carrier type comprises electrons, the first work function is greater than the second work function and (ii) for a second majority carrier type split-gate memory device, wherein the second majority carrier type comprises holes, the first work function is less than the second work function;
    forming a first current electrode in the substrate; and
    forming a second current electrode in the substrate separated from the first current electrode by a channel underlying the control gate and select gate, wherein prior to forming the select gate and the control gate, the method comprising: forming a counter doped region proximate a top surface of the substrate in at least the first and second portions, wherein the counter doped region is configured to modify a work function of a channel region within the first and second portions of the substrate.

2. The method of claim 1, wherein for the first majority carrier type, the first work function is greater than the second work function by an amount on an order of greater than 300 milli-electron volts.

3. The method of claim 1, wherein for the second majority carrier type, the first work function is less than the second work function by an amount on an order of greater than 300 milli-electron volts.

4. The method of claim 1, wherein the select gate and the substrate are of a common conductivity type.

5. The method of claim 1, wherein the counter doped region includes a conductivity type opposite to a conductivity type of the substrate.

6. The method of claim 1, wherein forming the counter doped region comprises implanting N-type dopant species for the first majority carrier type split-gate memory device.

7. The method of claim 1, further wherein for an N-type split gate memory device, the counter doped region is configured to lower the work function of the channel region, and further wherein for a P-type split gate memory device, the counter doped region is configured to raise the work function of the channel region.

8. The method of claim 1, wherein forming the select gate further comprises:
    forming a layer of select gate dielectric over at least the first portion of the substrate;
    forming a layer of select gate material overlying the layer of select gate dielectric; and
    implanting dopant into the layer of select gate material, wherein the dopant comprises a conductivity type suitable for establishing the first work function.

9. The method of claim 8, wherein forming the select gate still further comprises:
    forming an implant blocking layer overlying the layer of select gate material;
    defining a first edge of the select gate in the layer of select gate material, wherein defining the first edge includes etching to remove the implant blocking layer, the layer of select gate material and the layer of select gate dielectric in at least a region overlying the second portion of the substrate intended for use with respect to the control gate; and wherein forming the control gate further comprises:
- forming a discrete charge storage layer overlying (i) the implant blocking layer, (ii) the layer of select gate material, (iii) the first edge of the select gate, and (iv) a surface of the substrate exposed by defining the first edge of the select gate;
- forming a layer of control gate material overlying the discrete charge storage layer; and
- defining the control gate in the layer of control gate material, wherein defining the control gate includes etching to remove the layer of control gate material and the discrete charge storage layer in at least a region not intended for use as the control gate, wherein a portion of the control gate overlies the second portion of the substrate.

10. The method of claim 9, wherein the implant blocking layer comprises a nitride antireflective coating layer.

11. The method of claim 9, wherein a portion of the control gate also overlies the first edge of the select gate.

12. The method of claim 9, wherein forming the select gate still further comprises:
- defining a second edge of the select gate, wherein defining the second edge includes etching to remove the implant blocking layer, the layer of select gate material and the layer of select gate dielectric in at least portions thereof outside of a region overlying the first portion of the substrate intended for use with respect to the select gate;
- forming temporary sidewall spacers along exposed sidewalls of the select gate and the control gate;
- forming deep source/drain implant regions within the substrate that are aligned to the temporary sidewall spacers and proximate to the second edge of the select gate and an edge of the control gate opposite to the second edge of the select gate;
- removing the temporary sidewall spacers;
- forming source/drain extension implant regions within the substrate in at least regions of the substrate underlying the temporary sidewall spacers prior to their removal;
- removing the implant blocking layer overlying the select gate; and
- forming sidewall spacers along exposed sidewalls of the select gate and the control gate.

13. The method of claim 12, wherein removing the implant blocking layer overlying the select gate comprises removing substantially all portions, wherein a portion of the implant blocking layer remains proximate the first edge of the select gate, underlying a portion of the discrete charge storage layer of the control gate proximate the first edge of the select gate.

14. The method of claim 12, wherein the discrete charge storage layer comprises one selected from the group consisting of a nanocluster layer and a nitride layer containing trap locations.

15. A method of forming a split-gate memory device comprising:
- forming a counter doped region proximate a top surface of a substrate in at least first and second portions, wherein the counter doped region is configured to modify a work function of a channel region within the first and second portions of the substrate;
- forming a select gate having a first work function overlying a first portion of a substrate, wherein forming the select gate includes (i) forming a layer of select gate dielectric over at least the first portion of the substrate, (ii) forming a layer of select gate material overlying the layer of select gate dielectric, and (iii) implanting dopant into the layer of select gate material, wherein the dopant comprises a conductivity type suitable for establishing the first work function;
- forming a control gate having a second work function overlying a second portion of the substrate proximate the first portion, wherein (i) for a first majority carrier type split-gate memory device, wherein the first majority carrier type comprises electrons, the first work function is greater than the second work function and (ii) for a second majority carrier type split-gate memory device, wherein the second majority carrier type comprises holes, the first work function is less than the second work function;
- forming a first current electrode in the substrate; and
- forming a second current electrode in the substrate separated from the first current electrode by a channel underlying the control gate and select gate.

16. The method of claim 15, wherein forming the select gate further comprises:
- forming an implant blocking layer overlying the layer of select gate material;
- defining a first edge of the select gate in the layer of select gate material, wherein defining the first edge includes etching to remove the implant blocking layer, the layer of select gate material and the layer of select gate dielectric in at least a region overlying the second portion of the substrate intended for use with respect to the control gate; and wherein forming the control gate further comprises:
- forming a discrete charge storage layer overlying (i) the implant blocking layer, (ii) the layer of select gate material, (iii) the first edge of the select gate, and (iv) a surface of the substrate exposed by defining the first edge of the select gate;
- forming a layer of control gate material overlying the discrete charge storage layer; and
- defining the control gate in the layer of control gate material, wherein defining the control gate includes etching to remove the layer of control gate material and the discrete charge storage layer in at least a region not intended for use as the control gate, wherein a portion of the control gate overlies the second portion of the substrate.

* * * * *